United States Patent
Saito et al.

(10) Patent No.: US 6,476,683 B1
(45) Date of Patent: Nov. 5, 2002

(54) ADAPTIVE SWITCHING SPEED CONTROL FOR PULSE WIDTH MODULATION

(75) Inventors: Masayuki Saito, West Bloomfield, MI (US); Kang Li, Windsor (CA)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 09/625,351

(22) Filed: Jul. 25, 2000

(51) Int. Cl.$^7$ .................................................. H03K 7/08
(52) U.S. Cl. ....................... 332/109; 315/307; 315/291; 327/172; 327/175
(58) Field of Search ................................. 327/172, 175; 332/109; 315/291, 307

(56) References Cited

U.S. PATENT DOCUMENTS

| | | | |
|---|---|---|---|
| 4,841,198 A | | 6/1989 | Wilhelm |
| 5,021,727 A | | 6/1991 | Mashino |
| 5,218,239 A | | 6/1993 | Boomer |
| 5,959,481 A | * | 9/1999 | Donnelly et al. ............ 327/170 |
| 6,084,378 A | * | 7/2000 | Carbolante ................... 318/811 |
| 6,185,082 B1 | * | 2/2001 | Yang ............................ 361/90 |

* cited by examiner

Primary Examiner—Arnold Kinkead
(74) Attorney, Agent, or Firm—Sughrue Mion, PLLC

(57) ABSTRACT

A pulse width modulation apparatus and method operates a switch at one of four slew rates to minimize electromagnetic and harmonic interference or switching losses. One of the four slew rates is selected based on a detected over-current condition, with or without a start up operation condition, an over-temperature condition and a normal working mode.

37 Claims, 7 Drawing Sheets

System Block Diagram

System Flow Chart

System Block Diagram

ADAPTIVE SWITCHING SPEED CONTROL FOR PULSE WIDTH MODULATION

FIELD OF THE INVENTION

Pulse width modulation (PWM) is a method to control the root mean square voltage ($V_{RMS}$) across loads by dividing a DC voltage into pulses. Varying the pulse width in a PWM period controls the $V_{RMS}$ across loads. To limit the electromagnetic interference (EMI) of a PWM system, the PWM pulses are not perfectly squared signals. EMI is reduced by having the rise and fall time of the pulses to be as long as possible. The long rise/fall times permit the switching components (SCs), such as FETs, to be turned on and off smoothly and reduce harmonic interference. This usually does not create a problem for a switching component even though power dissipation in the form of heat results from a prolonged turn on/turn off time. Heat sinks can be used in conjunction with the SCs to dissipate thermal effects. However, in high current applications, such as short circuit protection or a running motor condition, the small turn-off slew rate creates losses in the form of excessive heat, which can damage the switching component in the event of an abnormally high current cut-off. In such situations, a rapid turn off is the only way to protect the switching component.

Conventional PWM systems apply a fixed turn on/off slew rate such that either the EMI is reduced or the switching loss is reduced, but not both. An attempt to minimize both EMI and switching losses has generally been viewed as contradictory. Usually, EMI reduction receives higher priority. To counter the effects of switching losses when EMI reduction is optimized, PWM system designers have turned to larger switching components and larger heat sinks to handle unusually high current levels. The larger switching components and heat sinks require additional space and weight to be added to the PWM system. These larger components may also increase the price of the PWM system.

SUMMARY OF THE INVENTION

The present invention overcomes the above deficiencies by employing an adaptive switching speed control (ASC) for PWM. Different switching slew rates are used for different working modes, which include the normal mode where EMI reduction is given priority and an over-current mode, where reduction of switching losses is given priority. In the over-current mode, the invention further takes into consideration whether a start up operation condition exists to provide a third mode of operation. In the start up operation mode, the ASC PWM provides a semi-large switching slew rate and a certain amount of current inrush. In particular, for an automotive lighting system, a long start up time is not acceptable to bring an automotive lamp, such as a braking-indicator lamp, a turn signal-indicating lamp or a high beam lamp, into a luminous condition. To shorten this start up time, a certain amount of inrush current (e.g., 150%–200% of normal operating current) is needed during start up. However, inrush current is highly dependent on the turn-off slew rate of the control signal of a switching component. A fast turn off will result in a smaller inrush current during the start up period. Therefore, when a certain amount of inrush current is necessary for a start up operation of a lamp, the ASC PWM operates the switching component with a semi-large turn off slew rate to provide a certain amount of inrush current during the start up period. This transition only exists for certain PWM channels where a certain amount of inrush current is necessary. The present invention also provides an over-temperature mode as a fourth mode of operation. The over-temperature mode is characterized by an intermediate switching slew rate that expands the working temperature range of a device controlled by a PWM circuit in the event of high ambient temperatures. In the normal mode, the switching slew rates are small, providing a long switching transition to reduce EMI and detrimental harmonic effects. In the over-current mode, the switching slew rates for the falling edge are large, providing a short switching transition to reduce switching losses and avoid damage to the switching component. In the start up operation mode, the switching slew rate is slightly smaller than in the in over-current mode where no start up condition exists. In the over-temperature mode, an intermediate switching slew rate between that of the normal mode and the over-current modes is used.

Functionally, an adaptive switching speed control PWM (ASC PWM) system includes three sections: The controller and drivers, the power switches and loads, and the ASC controller. The present invention is directed to the ASC controller of the system. Since all components of the ASC controller are smaller power components, it is possible to integrate the ASC controller into a trigger driver of switch components, e.g., a high side N channel power MOSFET driver. This would provide an efficient implementation for a practical ASC PWM system. The integration is helpful to reduce the number of components in the system, reduce the size of the system and increase the system reliability as well.

BRIEF DESCRIPTION OF THE DRAWINGS

A preferred embodiment of the invention will be described below with references to the drawings in which.

DESCRIPTION OF PREFERRED EMBODIMENT

Figure 1:
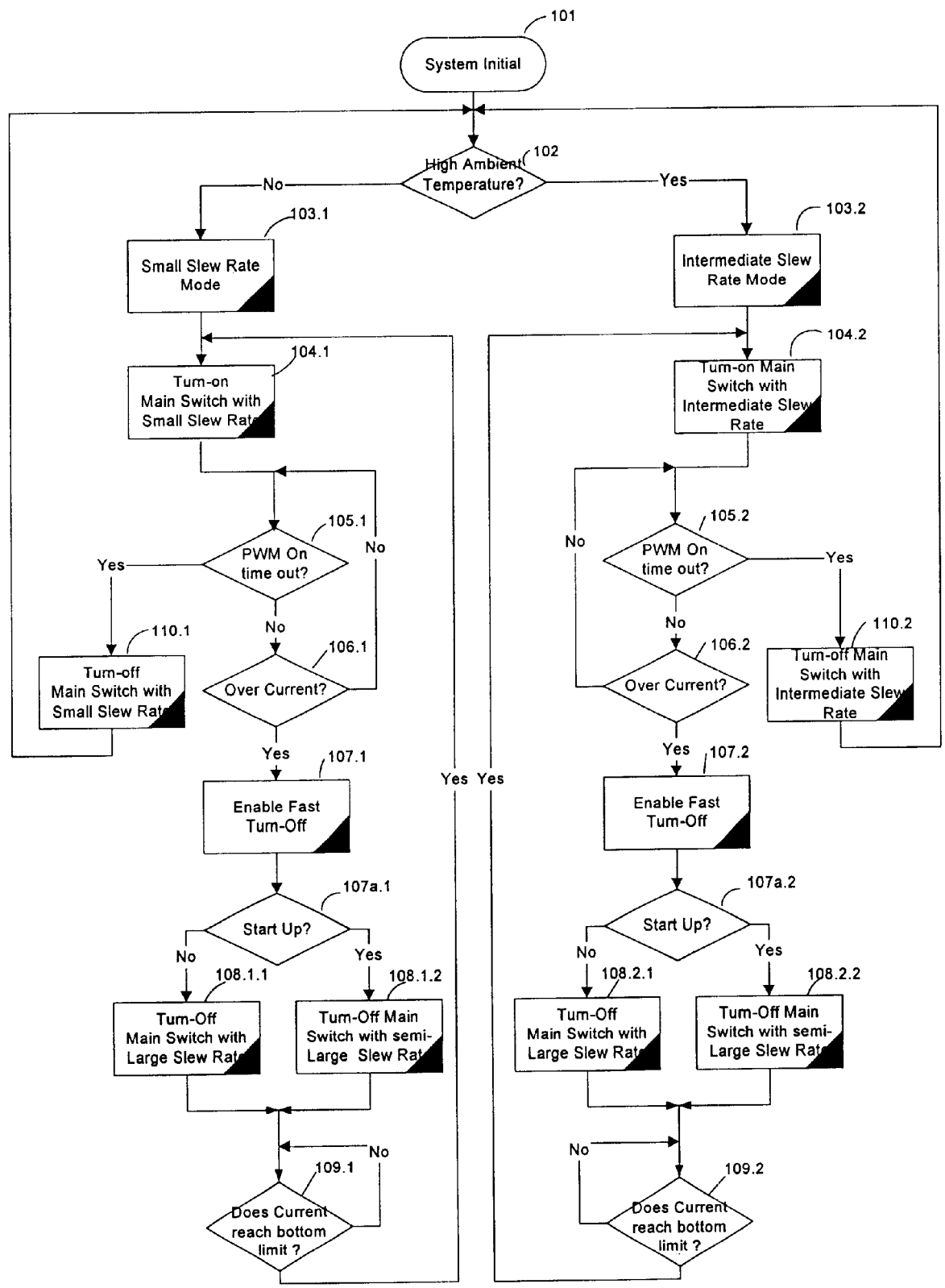
FIG. 1 is a flowchart illustrating the operation of the adaptive switching speed control system according to a preferred embodiment of the present invention.

Referring to FIG. 1, the overall operation of a preferred embodiment of the invention will be explained. At step 101, system operation commences. This may correspond to a power-on reset, a trigger signal check or channel selection. This step prepares the system for PWM operation. At step 102, when the system is ready for PWM operation, the system controller checks the ambient temperature. Based on the detected temperature, the system selects one of the normal working mode featuring a small switching on/off slew rate or an over-temperature mode, featuring a more rapid switching on/off slew rate. When the detected temperature is higher than a predetermined threshold, the controller selects the more rapid switching mode to reduce switching loss, consequently widening the working temperature range of switching components operating on the system. After temperature detection step 102, the process branches based on the appropriate mode. Steps 10X.1 correspond to the small slew rate switching mode to reduce EMI, and steps 10X.2 correspond to the intermediate slew rate switching mode for over-temperature operation. The two branches are described in turn.

If the detected temperature is equal to or below the predetermined threshold, the main switches are turned on at a small slew rate (small $di_1/dt$ or small $dv_1/dt$). Step 104.1. At step 105.1, the system controller checks for the condition of whether the on-time for the PWM pulse has run out. The on-time for the PWM pulse depends on the pre-set duty cycle for PWM. If it is determined that the on time has lapsed for the pulse, the procedure goes to step 110.1 to turn off the main switch at a small slew rate (small $di_1/dt$ or small $dv_1/dt$) according to the normal working mode and returns to the detection of the over-temperature condition in step 102.

Otherwise, it is determined that the on time for the PWM pulse has not yet lapsed, and the system proceeds to step 106.1 to determine whether an over-current condition exists. If there is no over-current condition, the procedure returns to step 105.1 to again determine whether the on-time for the PWM pulse has lapsed. If the over current condition is detected, the fast response procedure begins at step 107.1. A start up condition is next detected at step 107a.1. The start up condition corresponds to a time where a certain amount of inrush current is intentionally applied to a load, such as a vehicle headlamp (which works as a passing lamp), to stabilize its operation just as the headlamp is switched on.

Depending on whether a start up condition is present for the PWM channel, the fast turn off can be enabled in at least two ways. The ASC controller can cut off the switching components immediately or the PWM pulse can be turned on and off rapidly during the duration of the on time of the PWM pulse. The second implementation is described in more detail below. In normal working mode, the fast turn-off is active for the over-current condition only. In this mode, the turn off slew rate is approximately 40 times larger than in the normal working mode. Over-current mode, without the start up condition, has a large $di_2/dt$ or a large $dv_2/dt$. The fast turn-off has no effect on normal falling PWM edges.

Step 108.1.1 turns off the main switch at a large slew rate or large $di_2/dt$ or $dv_2/dt$, thereby commencing current discharge.

In the start up operation, step 108.1.2 turns off the main switch in a semi-large turn off mode at $di_3/dt$ or $dv_3/dt$, where $di_2/dt>di_3/dt>di_1/dt$, or $dv_2/dt>dv_3/dt>dv_1/dt$. The smaller slew rate in the start up operation permits a larger current inrush during the start up time of the vehicle lamps.

At step 109.1, the system determines whether the decreasing current has reached a preset lower limit. During this time, the main switch remains off. When the current reaches the lower limit, the procedure returns to step 104.1 to turn on the main switch. The switch on slew rate will be performed according to the normal switch on rate corresponding to $di_1/dt$ or $dv_1/dt$. The steps for determining whether the on-time of the pulse width modulation cycle has run (step 105.1), determining whether over-current exists (step 106.1), and determining whether a start up condition exists (step 107a.1) are performed reiteratively until the on-time of the pulse cycle has lapsed. When the cycle has lapsed, the main switch is turned off at the small slew rate $di_1/dt$ or $dv_1/dt$, and the procedure returns to step 102 to check the ambient temperature. The above steps describe the case where no over-temperature condition exists.

If at step 102, it is determined that the over-temperature condition exists, then the intermediate slew rate over-temperature switching mode commences at step 103.2. Since the detected ambient temperature exceeds the threshold value, to keep the main switches operational in safe thermal circumstances, it is necessary to decrease the switching loss (power dissipation) on the main switches. When the switching frequency (PWM frequency) is fixed, the only way to decrease switching loss is to shorten the rise and fall time of the PWM pulses.

At step 104.2, the main switches are turned on at an intermediate slew rate characterized by $di_4/dt$ or $dv_4/dt$, where $di_2/dt>di_3/dt>di_4/dt>di_1/dt$, or $dv_2/dt>dv_3/dt>dv_4/dt>dv_1/dt$.

At step 105.2, the system controller determines whether the on time for a PWM pulse has lapsed. The on-time depends on a preset duty cycle. If the on time has lapsed, the procedure proceeds to step 110.2 to turn off the main switch and back to step 102 to determine whether the over-temperature condition exists. This turn off at step 110.2 is performed according to $di_4/dt$ or $dv_4/dt$.

If the PWM on time has not lapsed, then a determination is made as to whether the over-current condition exists. If there is no over-current condition, the procedure returns to step 105.2 to determine again whether the PWM on time has lapsed. If the over-current condition does exist, then the enable fast turn-off procedure is implemented at step 107.2 At step 107a.2, it is further determined whether the start up condition exists.

If the start up condition does not exist, then the main switch is turned off at the large slew rate ($di_2/dt$ or $dv_2/dt$) in step 108.2.1. If the start up condition does exist, then start up operation for semi-large switch off occurs at step 108.2.2, at $di_3/dt$ or $dv_3/dt$.

At step 109.2, the decreasing current is detected, and it is determined whether the current has reached a bottom limit. If not, step 109.2 is repeated reiteratively until the bottom limit is reached. Once the bottom limit is reached, the procedure returns to step 104.2 to turn on the main switch at an intermediate rate $di_4/dt$ or $dv_4/dt$ corresponding to the over-temperature condition. As in the normal mode situation, the steps of determining whether the pulse width on-time has lapsed (step 105.2), determining whether the over-current condition exists (step 106.2), and determining whether the start up operation condition exists (step 107a.2) are performed reiteratively until the on-time for the PWM pulse lapses. At that time, the main switch is turned off at the intermediate slew rate $di_4/dt$ or $dv_4/dt$, and the procedure returns to step 102 to detect the ambient temperature.

Figure 2:
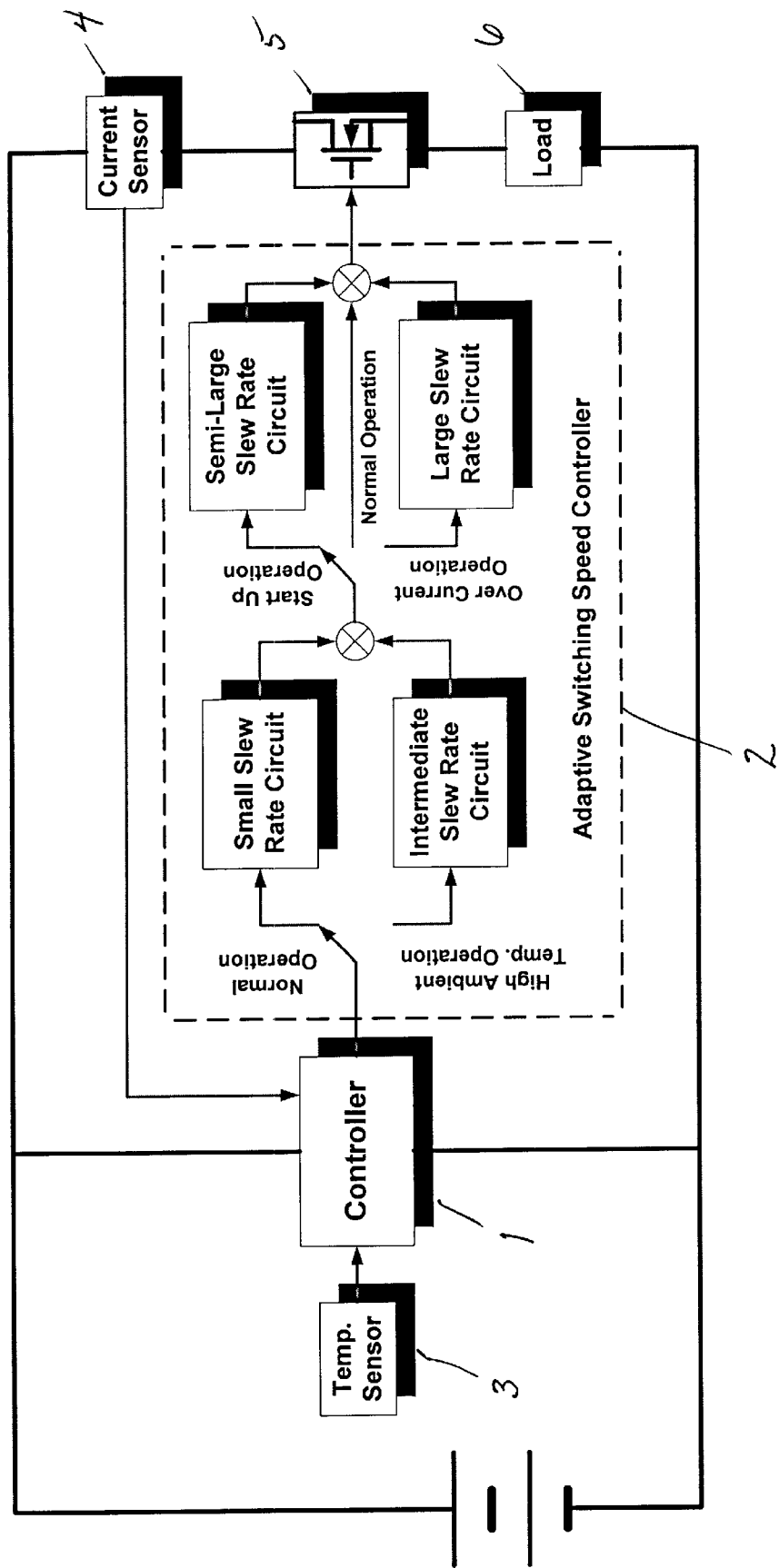
FIG. 2 is a block diagram of a system including an adaptive switching speed controller of the present invention.

FIG. 2 illustrates an overall system in which the adaptive switching speed controller is used. The adaptive switching speed controller (ASC) 2 receives signals from a main controller 1, which detects the temperature and current conditions according to temperature sensor 3 and current sensor 4. The ASC PWM supplies switching signals to a main switch 5 controlling a load 6 based on the detected temperature and current.

Figure 5:
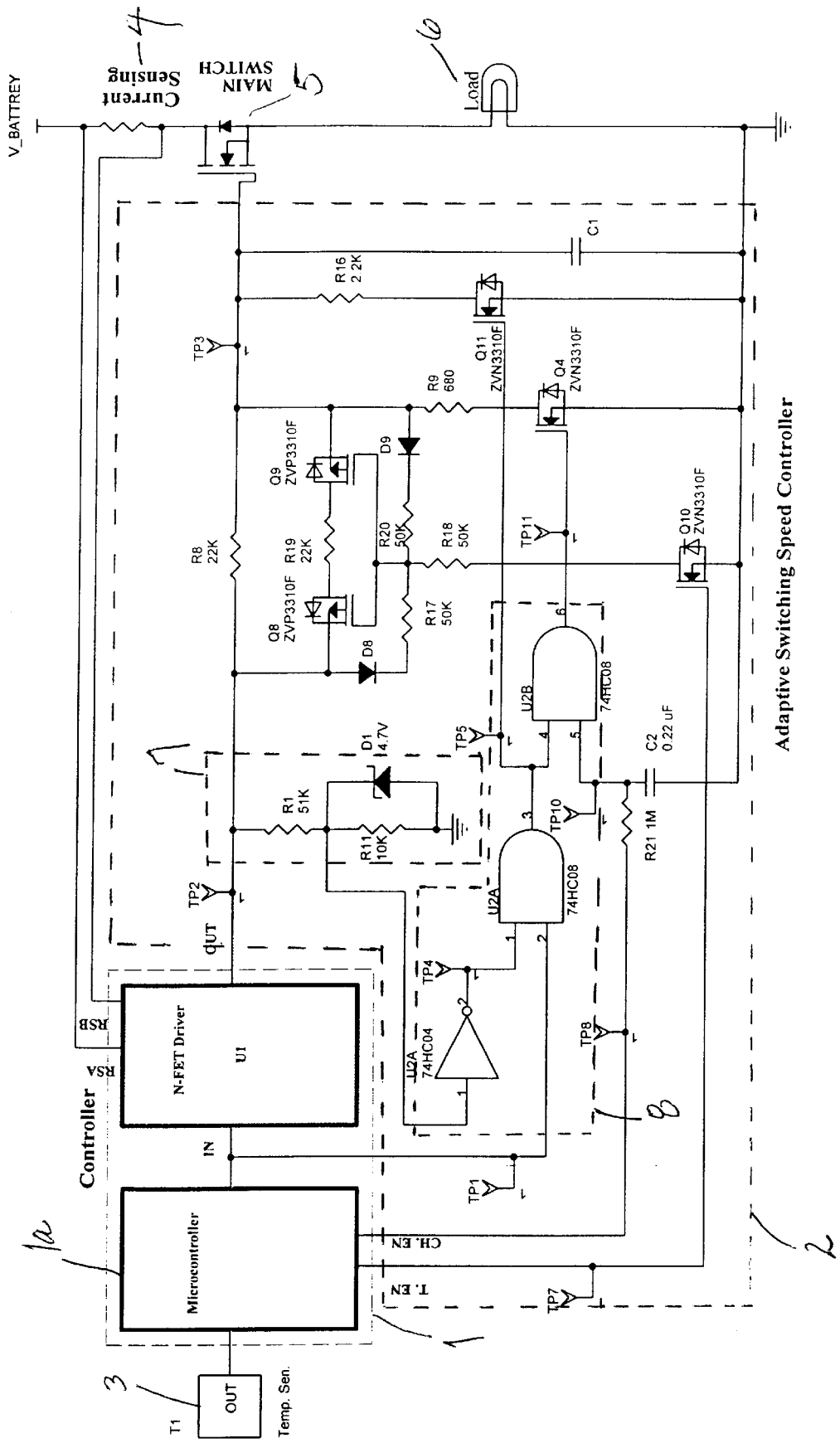
FIG. 5 is a schematic diagram of the adaptive switching speed controller illustrated in FIG. 2.

A preferred embodiment of the circuit is illustrated in FIG. 5, which shows a temperature sensor 3 providing an input to the main controller 1 including a microcontroller 1a and a MOSFET driver U1. The controller system, in turn, provides an output to the adaptive switching speed controller 2. The microcontroller 1a generates PWM pulses (TTL levels) and transmits the pulses to driver U1. The transistor driver shifts the received signal to a trigger signal $S_{TP2}$, which is typically about ten volts over the supply voltage to operate the main switch 5. On the gate of the main switch 5, the straight rise edge of $S_{TP2}$ is slowed down by R8 and $C_1$ to turn on the switch slowly. The logic circuit 8 cannot use $S_{TP2}$ directly. Therefore, a level shifting network 7 (R1, R11 and D1) transfers $S_{TP2}$ to $S_{TP2}'$ which is a TTL level.

The various modes of operation for the above circuit will be described below with reference to the equivalent circuits 3A–3H and the timing diagrams 4A–4C.

Figure 3A:
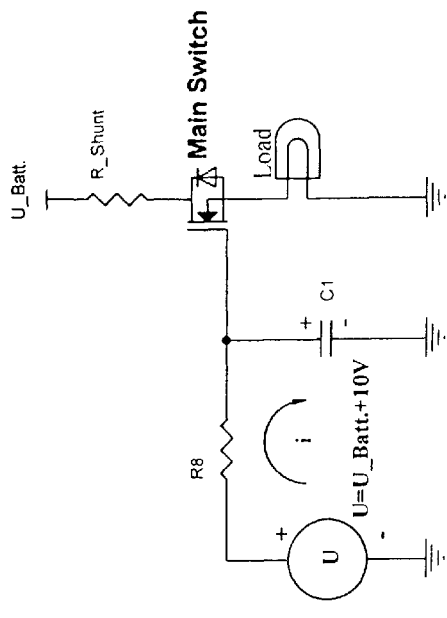
FIGS. 3A–3H are equivalent diagrams for explaining the operation of the adaptive switching speed controller according to a preferred embodiment of the invention.
Figure 3B:
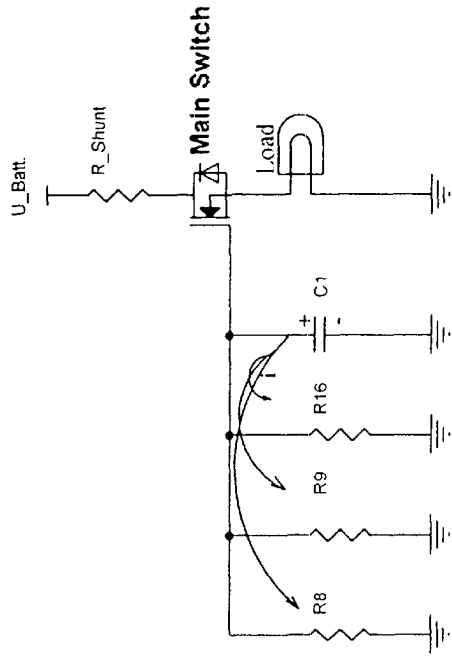
Figure 3C:
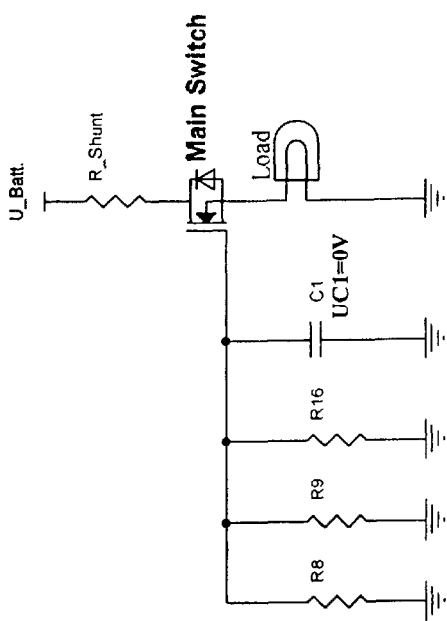
Figure 4A:
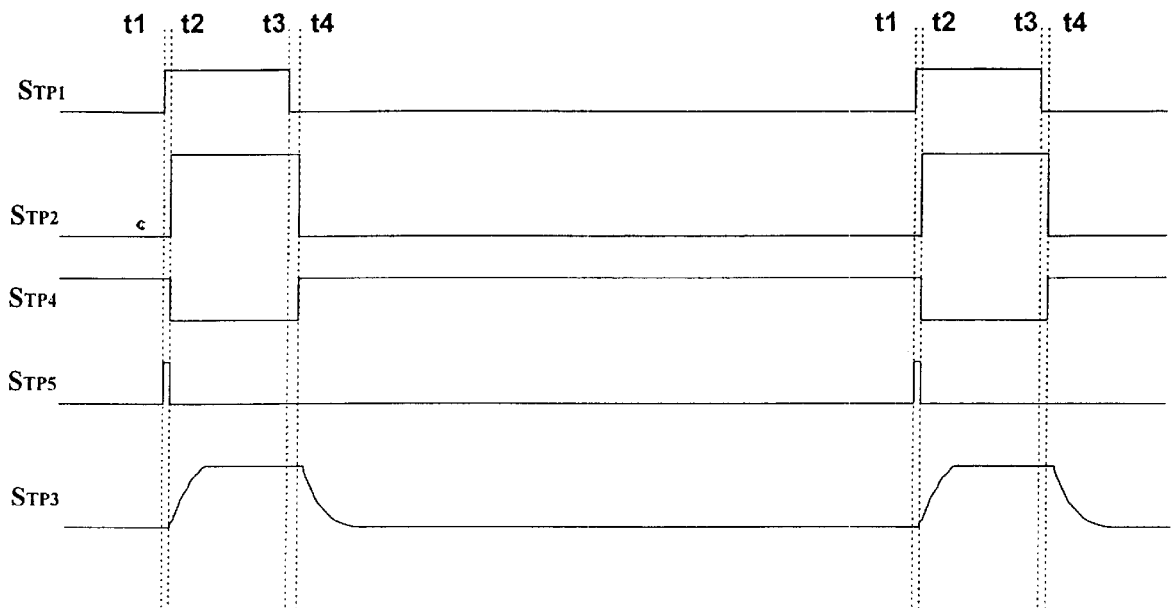
FIGS. 4A–4C are timing diagrams for describing the operation of the adaptive switching speed controller.

Normal operation. As shown in FIG. 4A and FIG. 5, at time t1, the output of the microcontroller 1a $S_{TP1}$ goes high based on a preset duty cycle. $S_{TP2}$ remains low because of the delay imparted by the driver U1. With $S_{TP1}$ in a high state and $S_{TP2}$ in a low state, $S_{TP5}$ goes high turning on transistor Q11 (and Q4, except in the case of a start up operation). The activation of Q11 and Q4 has no effect on the main switch since the output of U1 at this time is zero volts. An equivalent circuit is shown in FIG. 3A. After a delay, $S_{TP2}$ goes high at time t2. $S_{TP5}$ goes low and remains low, thereby turning off Q11 and Q4 off until the next occurrence of t1 at the beginning of the next PWM cycle. $S_{TP2}$ passes the slow-down network (R8, C1) at $S_{TP3}$ which turns on the main switch slowly. The equivalent circuit is shown in FIG. 3B. At time t3, $S_{TP1}$ goes low according to a preset PWM duty cycle. $S_{TP2}$ remains high because of delay. At t4, $S_{TP2}$ goes low. C1 discharges through R8 and C1. This makes $S_{TP3}$ go low slowly, thereby turning off the main switch slowly. The equivalent circuit is shown in FIG. 3C.

Figure 4B:
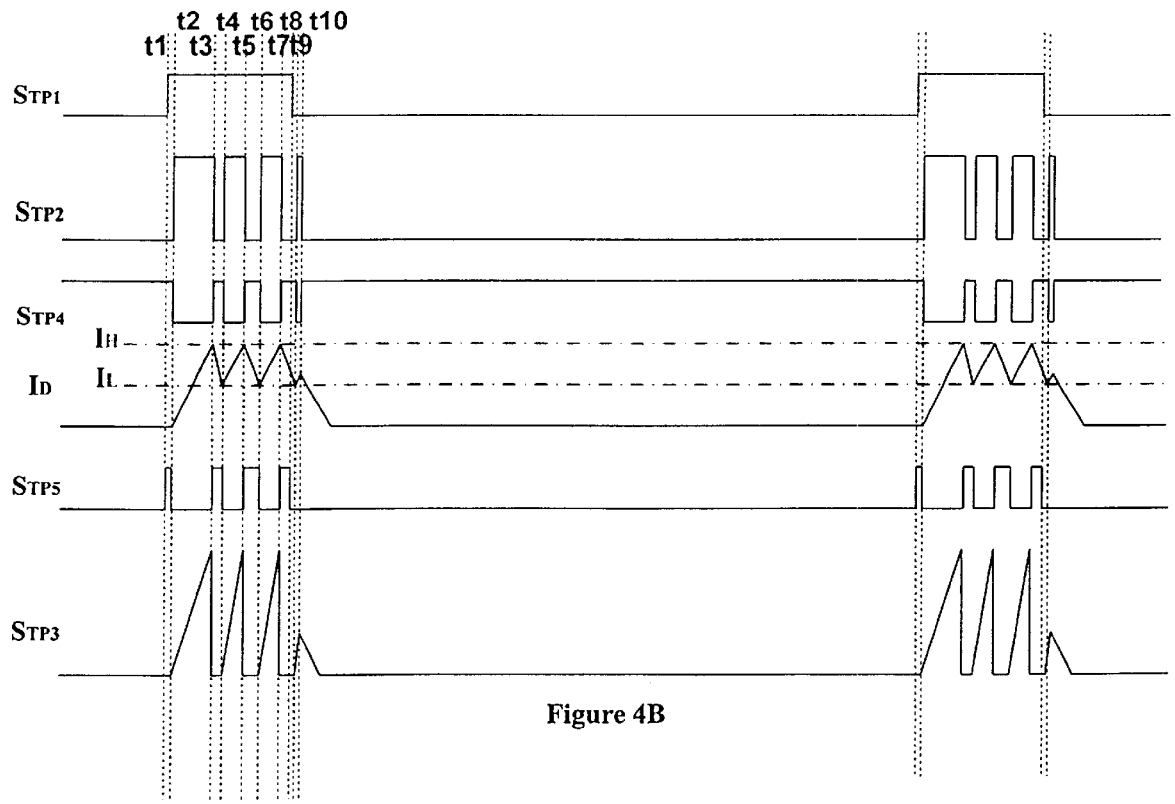

Over-Current Mode. Referring to FIG. 4B and FIG. 5, at time t1, the output of the microcontroller 1A $S_{TP1}$ goes high based on a preset duty cycle. $S_{TP2}$ remains low due to delay. $S_{TP5}$ goes high and turns on Q11 and Q4. At this time, the activation of Q11 and Q4 has no effect on the main switch operation since there is no signal on the U1 pin OUT or on the gate of the main switch. The equivalent circuit is shown in FIG. 3A. At time t2, $S_{TP2}$ goes high and $S_{TP5}$ goes low, turning off Q11 and Q4. $S_{TP3}$, which is a slowed down signal of $S_{TP2}$ turns on the main switch slowly. The equivalent circuit is shown in FIG. 3B. The drain current of the main switch starts to go up. This current flow is detected by the current sensor 4, which supplies an input to the driver U1.

Figure 3D:
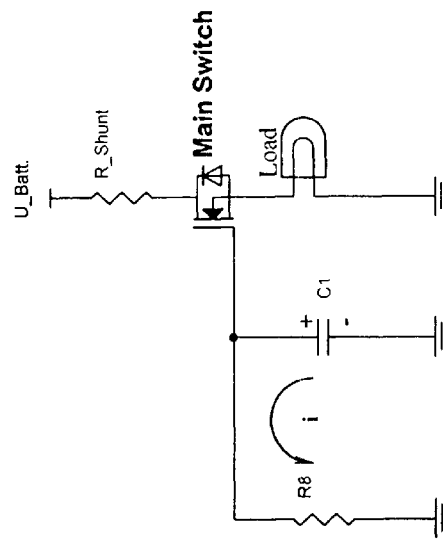

At time t3, the current reaches the current limit $I_H$. Driver U1 receives an indication that the drain current has reached this threshold via the current sensor output. The current limit function inside of U1 forces $S_{TP2}$ to go low, making $S_{TP4}$ go high immediately. Since $S_{TP1}$ is still high, the condition of $S_{TP5}$ is only decided by $S_{TP4}$. Therefore, $S_{TP5}$ goes high, turning on Q11 and Q4. The capacitor C1 discharges through R16-Q11 and R9-Q4 at a speed approximately 40 times that of the normal working mode, which only discharges through R8. The speed at which discharge occurs can be controlled by selection of the resistors R8, R9 and R16. The main switch is thus turned off very quickly. The equivalent circuit is shown in FIG. 3D.

The current starts going down in a smooth manner due to the parasitic inductance in the circuit. At time t4, the current reaches the low current limit threshold $I_L$. The current limit function in U1 makes $S_{TP2}$ go high. $S_{TP5}$ goes low turning off Q11 and Q4. $S_{TP3}$ goes up turning on the main switch smoothly. The current continues to go up until reaching $I_H$, where U1 again forces $S_{TP2}$ to a low value. The system repeats the operations described above until time t8. At t8, $S_{TP1}$ goes low. The low value of STP, keeps $S_{TP5}$ low until the next time t1. Because of the delay, $S_{TP2}$ goes high as the detected drain current reaches IL at time t9. $S_{TP3}$ continues to go up until time t10. At t10, the U1 delay time is over, and $S_{TP2}$ goes low. In this case, Q11 and Q4 are off ($S_{TP5}$ is low). C1 discharges through R8 at a slow rate. The equivalent circuit is shown in FIG. 3C.

Figure 4C:
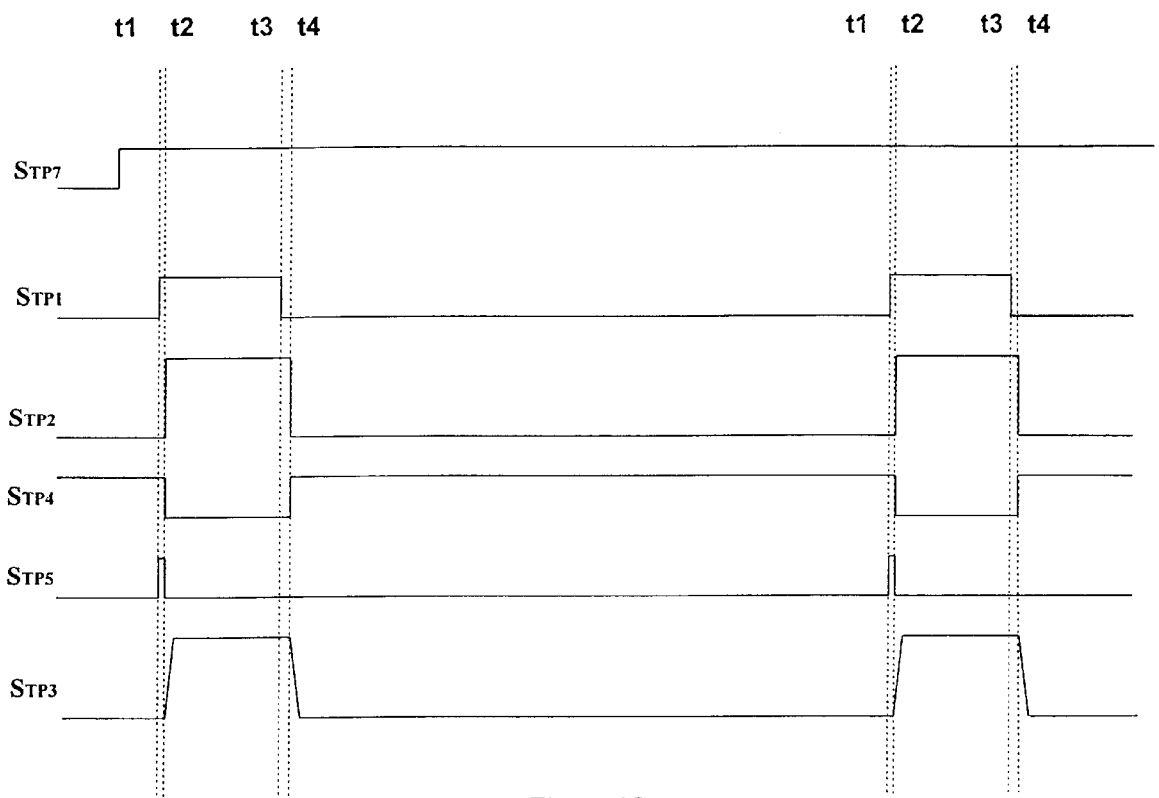

High Ambient Temperature Operations. The microcontroller 1a monitors ambient temperature. If the temperature is higher than a predetermined temperature threshold, the control sets the Temperature Enable signal (T.EN, $S_{TP7}$) to high. As illustrated in FIG. 4C, some time before t1, the controllers makes T.EN ($S_{TP7}$) high. This turns on Q10. At time t1, $S_{TP1}$ goes high. $S_{TP2}$ remains low because of delay. $S_{TP5}$ goes high turning on Q11 and Q4. The turning on of these transistors has no effect on the main switch operation because both U1 pin OUT and the gate of the main switch are zero volts at this time. The equivalent circuit is shown as in FIG. 3A. At time t2, $S_{TP2}$ goes high, $S_{TP4}$ goes low, $S_{TP5}$ goes low turning off Q1 and Q4. $S_{TP5}$ remains low until the next occurrence of t1.

Figure 3F:
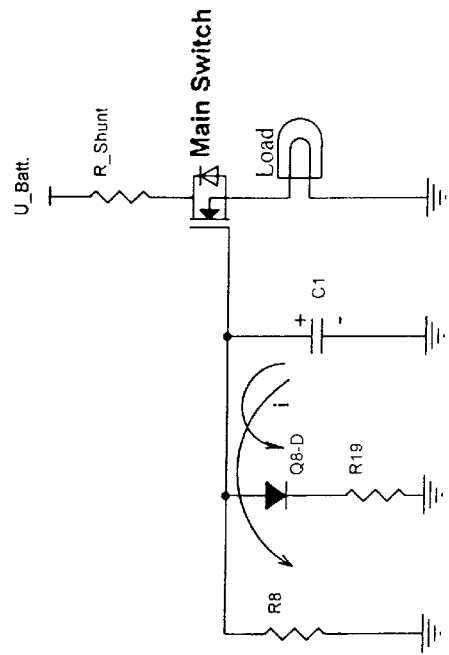
Figure 3H:
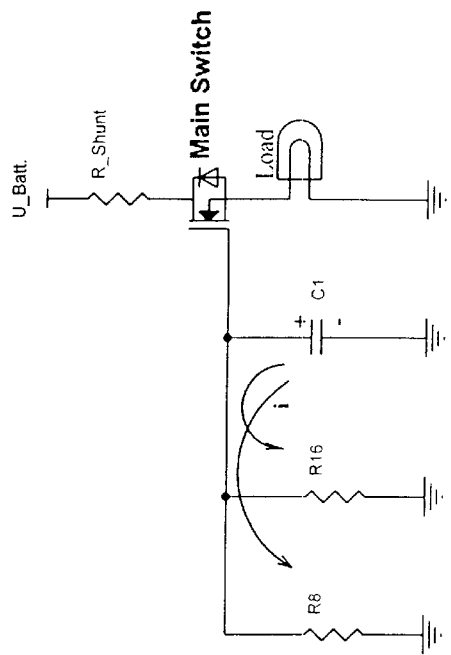
Figure 3E:
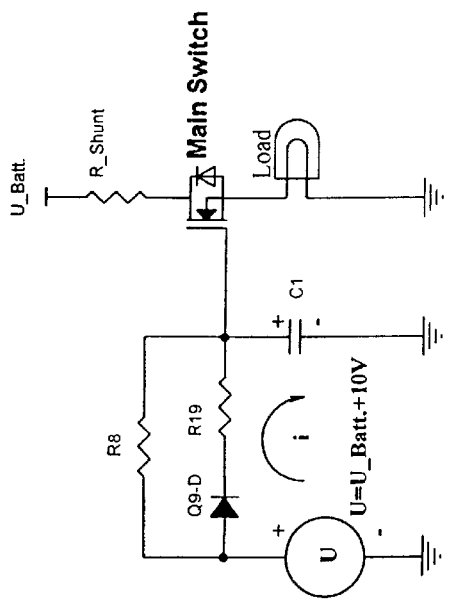

Since $S_{TP2}$ is high while Q10 is turned on, some voltage drop across D8 and R17 is incurred. The voltage drop across D8 and R17 turns on Q8. Current goes through Q8, R19 and the parasitic diode of Q9 (Q9-D) and R8 also charging C1. The main switch is turned on about two times faster than normal (through R8 only). The equivalent circuit is shown in FIG. 3E. As apparent from FIG. 3E, the speed of charging can be controlled by selection of the resistance values for R8 and R19. At time t3, $S_{TP1}$ goes low. Because of delay, $S_{TP2}$ remains high until t4. At time t4, $S_{TP2}$ goes low. Since the voltage on C1 cannot go down to zero immediately, some current goes through D9, R20, R18 and Q10 to ground. Some voltage drop is incurred across D9 and R20. The voltage drop across D9 and R20 turns on Q9. C1 discharges through R8 as well as through Q9, R19 and parasitic diode of Q8 (Q8-D) and turning off the main switch at a double slew rate when compared to the normal working mode. The equivalent circuit is shown in FIG. 3F. The diodes D8 and D9 function as breaks to prevent current from going through R17 and R20 directly. In case of over-current in the high ambient temperature mode, the system operation for the over-current condition is handled in the same manner as an over-current condition detected in the normal mode.

Figure 3G:
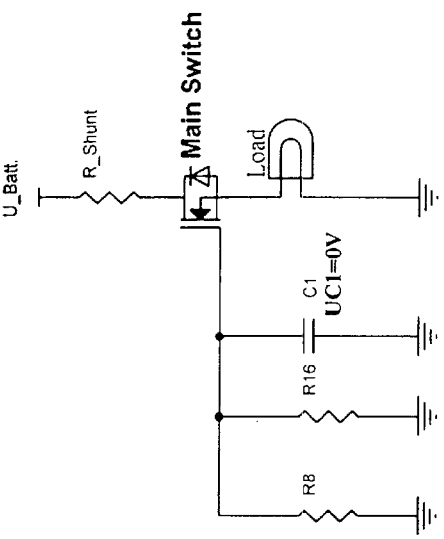

Start Up Operation. In some applications, such as automotive headlamps using halogen bulbs, concerns should be given not only to current controls but also to the start up time as well. Start up circuitry may be embedded in the ASC controller to shorten the starting period. As shown in FIG. 5, during the start period, the channel enable (CH.EN, $S_{TP8}$) supplied by the PWM controller charges C2 through R21. The potential level of C2 ($S_{TP10}$) goes up from zero volts. $STP_{10}$ remains logical "0" until the voltage on C2 reaches the logical "1" voltage threshold of U2B. The "0" level of $S_{TP10}$ makes $S_{TP11}$="0" which turns off Q4 regardless of the level of $S_{TP5}$. Therefore, within the start up period, over current operation ($S_{TP5}$) can only turn on Q11. C1 discharges through R16 and Q11 at about ten times faster than normal speed. The slower response for over current (start up) makes inrush current in the main circuit about 150% of these in fast response operations for over-current operations without the start up condition. The equivalent circuit is shown in FIG. 3G and 3H.

Generally the ASC controller turns off the main switch quickly only during the over current operation (during the on portion of the PWM duty cycle). The normal turn-off (corresponding to PWM falling edges) always keeps a smooth turn-off. This keeps EMI and harmonic interference as small as possible while keeping fast response for current control. The system allows the switches and devices to be configured with lower capacity heat sinks and smaller switching components to reduce the bulk, weight and cost of an electrical system.

Though the present invention has been described above with reference to a preferred embodiment, one skilled in the art can make modifications thereto without departing from the spirit and the scope of the present invention. For instance, although the apparatus has been described as providing slew rates for various conditions corresponding to normal, over-temperature and over-current conditions, with and with out a start up mode, one skilled in the art would understand that corresponding rise and fall slew rate can also be set for these conditions. In particular, the over current mode would have the largest fall slew rate, the start up mode would have a semi-large fall slew rate, the over-temperature condition would have an intermediate fall slew rate which is larger than in the over-current and start up conditions. Finally, the normal working mode would have the smallest fall slew rate. With regard to rise slew rate, one skilled in the art would recognize that the normal working mode that would have a larger rise slew rate than the over-temperature mode.

What is claimed is:

1. A pulse width modulation system comprising:
   at least one switch operating at least one load according to pulse width modulation;
   at least one temperature detector;
   at least one adaptive switching speed controller which operates the switch at varying slew rates according to an ambient temperature detected by the temperature detector; and
   at least one current detector disposed at the switch, wherein said adaptive switching speed controller deactivates the switch at a large slew rate when a current detected by said current detector exceeds a current threshold, wherein said large slew rate is larger than any of said varying slew rates.

2. A pulse width modulation system comprising:
   at least one switch operating at least one load according to pulse width modulation;
   at least one temperature detector; and
   at least one adaptive switching speed controller which operates the switch at varying slew rates according to an ambient temperature detected by the temperature detector;
   wherein said adaptive switching speed controller operates the switch at a first slew rate when the ambient temperature detected by said temperature detector is not greater than a temperature threshold and said adaptive switching speed controller operates the switch at a second slew rate when the ambient temperature detected by the temperature detector is greater than the temperature threshold, wherein the second slew rate is larger than the first slew rate.

3. The pulse width modulation system according to claim 1 further comprising at least one current detector disposed at the switch, wherein said adaptive switching speed controller deactivates the switch at a third slew rate when a current detected by said current detector exceeds a current threshold, wherein said third slew rate is larger than said first slew rate and is larger than said second slew rate.

4. The pulse width modulation system according to claim 3 further comprising at least one PWM controller providing an output to the adaptive switching speed controller, wherein the PWM controller detects a start up mode of operation, and wherein said adaptive switching speed controller deactivates the switch at a fourth slew rate when the start up mode is detected by said PWM controller, wherein said fourth slew rate is smaller than said third slew rate and is larger than said second slew rate and is larger than said first slew rate.

5. The pulse width modulation system according to claim 4, wherein said adaptive switching speed controller deactivates the switch at one of said third and fourth slew rates only during an on duration of a pulse width modulation cycle.

6. The pulse width modulation system according to claim 5, further comprising at least one control circuit, wherein during the on duration of the pulse width modulation cycle when said current detected by said current detector exceeds said current threshold, said control circuit repetitively switches on and off the switch during the on duration of the pulse width modulation cycle.

7. The pulse width modulation system according to claim 5, wherein when the on duration of the pulse width modulation cycle has lapsed, said adaptive switching speed controller deactivates the switch at one of said first and second slew rates depending on the ambient temperature detected by said temperature detector.

8. The pulse width modulation system according to claim 6, wherein said control circuit is a MOS FET driver.

9. The pulse width modulation system according to claim 3, further comprising at least one control circuit, wherein during an on duration of a pulse width modulation cycle when said current detected by said current detector exceeds said current threshold, said control circuit repetitively switches on and off the switch during the on duration of the pulse width modulation cycle.

10. The pulse width modulation system according to claim 9, wherein said control circuit is a MOS FET driver.

11. A pulse width modulation system comprising:
    at least one switch operating at least one load according to pulse width modulation;
    a current detector disposed at a switch;
    at least one adaptive switching speed controller which operates the switch at varying slew rates according to a current detected by a current detector wherein said adaptive switching speed controller is operable to operate the switch at a first slew rate and is operable to deactivate the switch at a second slew rate only when the current detected by the current detector is more than a threshold current,
    wherein the second slew rate is larger than said first slew rate; and
    a PWM controller providing an output to the adaptive switching speed controller, said PWM controller detecting a start up mode of operation, wherein said adaptive switching speed controller deactivates the switch at a third slew rate when the PWM controller detects the start up mode of operation, wherein said third slew rate is smaller than said second slew rate and is larger than said first slew rate.

12. The pulse width modulation system according to claim 11, further comprising at least one control circuit, wherein when the current detected by said current detector exceeds the threshold current, said control circuit repetitively activates and deactivates the switch during an on duration of a pulse width modulation cycle.

13. The pulse width modulation system according to claim 12, wherein when the on duration of the pulse width modulation cycle has lapsed, the adaptive switching speed controller deactivates the switch at said first slew rate.

14. The pulse width modulation system according to claim 12, wherein said control circuit is a MOS FET driver.

15. A pulse width modulation system comprising:
    at least one switch operating at least one load according to pulse width modulation;
    a current detector disposed at a switch;
    at least one adaptive switching speed controller which operates the switch at varying slew rates according to a current detected by a current detector wherein said adaptive switching speed controller is operable to operate the switch at a first slew rate and is operable to deactivate the switch at a second slew rate only when the current detected by the current detector is more than a threshold current, wherein the second slew rate is larger than said first slew rate; and at least one control circuit, wherein when the current detected by said detector exceeds the threshold current, said control circuit repetitively activates and deactivates the switch during an on duration of a pulse width modulation cycle.

16. The pulse width modulation system according to claim 15, wherein said control circuit is a MOS FET driver.

17. A method of setting a rise and fall slew rate for a switch in a pulse width modulation system comprising steps of:

detecting an ambient temperature;

comparing the detected ambient temperature with a temperature threshold value;

setting a rise and fall slew rate for a pulse of the switch according to a result of the comparing step.

18. The method of claim 17, wherein said setting step comprises setting a first rise slew rate and first fall slew rate when the detected ambient temperature is not greater than the temperature threshold; and setting a second rise slew rate and second fall slew rate for a pulse of the switch when the detected ambient temperature is greater than the temperature threshold, wherein said second rise slew rate is larger than said first rise slew rate and said second fall slew rate is larger than said first fall slew rate.

19. The method of claim 18, further comprising steps of:

detecting a current output at a switch of the pulse width modulation system; and comparing the detected current with a current threshold value; and setting a third fall slew rate when the detected current exceeds the current threshold value, wherein the third fall slew rate is larger than said first fall slew rate and is larger than said second fall slew rate.

20. The method according to claim 19, further comprising steps of detecting a start up mode of operation; and setting a fourth fall slew rate when the start up mode of operation is detected, wherein said fourth fall is smaller than said third fall slew rate and is larger than said first fall slew rate and larger than said second fall slew rate.

21. The method according to claim 20, wherein the third and fourth fall slew rates are set only during an on duration of a pulse width modulation cycle.

22. The method according to claim 21, wherein during the on duration of the pulse width modulation cycle, the switch is repetitively activated and deactivated when the detected current exceeds the current threshold.

23. The method according to claim 22, wherein when the on duration of the pulse width modulation cycle has lapsed, the switch is deactivated at one of said first and second fall slew rates depending on the detected ambient temperature.

24. The method according to claim 19, wherein during an on duration of a pulse width modulation cycle, the switch is repetitively activated and deactivated when the detected current exceeds the current threshold.

25. A method of setting a rise and fall slew rate for a pulse width modulation system comprising steps of:

detecting a current output at a switch;

comparing the detected current with a current threshold;

setting a rise and fall slew rate for a pulse of the switch according to a result of the comparing step, wherein said setting step comprises setting a first rise slew rate and first fall slew rate when the detected current is not greater than the current threshold; and setting a second fall slew rate for a pulse of the switch only when the detected current is greater than the current threshold, wherein said second fall slew rate is larger than said first fall slew rate.

26. The method according to claim 25 further comprising steps of:

detecting a start up mode of operation; and setting a third fall slew rate when the start up mode of operation is detected, wherein said third fall is smaller than said second fall slew rate and is larger than said first fall slew rate.

27. The method according to claim 26, wherein the third fall slew rate is set only during an on duration of a pulse width modulation cycle.

28. The method according to claim 27, wherein during the on duration of the pulse width modulation cycle, the switch is repetitively activated and deactivated when the detected current exceeds the current threshold.

29. The method according to claim 28, wherein when the on duration of the pulse width modulation cycle has lapsed, the switch is deactivated at said first fall slew rate, wherein said first fall slew rate is smaller than said second fall slew rate and is smaller than said third fall slew rate.

30. The method according to claim 25, wherein the second fall slew rate is set only during an on duration of a pulse width modulation cycle.

31. The method according to claim 30, wherein during an on duration of a pulse width modulation cycle, the main switch is repetitively activated and deactivated when the detected current exceeds the current threshold.

32. The pulse width modulation system according to claim 8, wherein said adaptive switching speed controller is integrated with said MOS FET driver.

33. The pulse width modulation system according to claim 14, wherein said adaptive switching speed controller is integrated with said MOS FET driver.

34. A pulse width modulation system comprising:

at least one switch operating at least one load according to pulse width modulation;

at least one temperature detector; and a at least one adaptive switching speed controller which operates the switch at varying slew rates according to an ambient temperature detected by the temperature detector relative to a threshold value;

wherein said load comprises a vehicle lamp connected to said switch.

35. The method according to claim 17 further comprising:

operating a vehicle lamp according to the set rise and fall slew rate of the switch.

36. A pulse width modulation system comprising:

at least one switch connected to a vehicle lamp and operating said vehicle lamp according to pulse width modulation;

a current detector disposed at a switch; and at least one adaptive switching speed controller which operates the switch at varying slew rates according to the current detected by the current detector relative to a current threshold.

37. A method of setting a rise and fall slew rate for a pulse width modulation system comprising steps of:

detecting a current output at a switch;

comparing the detected current with a current threshold;

setting a rise and fall slew rate for a pulse of the switch according to a result of the comparing step; and operating a vehicle lamp according to the set rise and fall slew rate for the switch.

* * * * *